US011862644B2

(12) United States Patent
Lv

(10) Patent No.: US 11,862,644 B2
(45) Date of Patent: Jan. 2, 2024

(54) ARRAY SUBSTRATE AND DISPLAY PANEL

(71) Applicant: TCL CHINA STAR OPTOELECTRONICS TECHNOLOGY CO., LTD., Guangdong (CN)

(72) Inventor: Xiaowen Lv, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 888 days.

(21) Appl. No.: 16/758,191

(22) PCT Filed: Apr. 3, 2020

(86) PCT No.: PCT/CN2020/083143
§ 371 (c)(1),
(2) Date: Apr. 22, 2020

(87) PCT Pub. No.: WO2021/179376
PCT Pub. Date: Sep. 16, 2021

(65) Prior Publication Data
US 2023/0119969 A1   Apr. 20, 2023

(30) Foreign Application Priority Data
Mar. 11, 2020 (CN) .................. 202010168142.4

(51) Int. Cl.
*H01L 27/12* (2006.01)
*G02F 1/1343* (2006.01)
*G02F 1/1362* (2006.01)

(52) U.S. Cl.
CPC ...... *H01L 27/124* (2013.01); *G02F 1/134309* (2013.01); *G02F 1/136227* (2013.01); *G02F 2201/123* (2013.01)

(58) Field of Classification Search
CPC ............. H01L 27/124; G02F 1/134309; G02F 1/136227; G02F 2201/123
See application file for complete search history.

(56) References Cited

U.S. PATENT DOCUMENTS

2017/0023837 A1\* 1/2017 Shin .................. G02F 1/136227
2019/0196276 A1   6/2019 Kim et al.

FOREIGN PATENT DOCUMENTS

| CN | 102759831 A | 10/2012 |
| CN | 105759518 A | 7/2016 |

(Continued)

*Primary Examiner* — Lucy P Chien
(74) *Attorney, Agent, or Firm* — PV IP PC; Wei Te Chung; Zhigang Ma

(57) ABSTRACT

The disclosure provides an array substrate and a display panel. The array substrate includes a plurality of data lines, a plurality of scan lines, a plurality of clock signal lines, and a plurality of pixel units formed by the data lines and the scan lines horizontally and vertically crossing each other. The data lines are disposed between two adjacent columns of the pixel units. The scan lines are disposed between two adjacent rows of the pixel units. The clock signal lines in an opening area of the pixel units are disposed in a plurality of orthographic projection areas of a plurality of trunk electrodes, are parallel to the data lines, and are disposed in a different layer from a pixel electrode.

16 Claims, 4 Drawing Sheets

(56) References Cited

FOREIGN PATENT DOCUMENTS

| | | |
|---|---|---|
| CN | 106353939 A | 1/2017 |
| CN | 107037656 A | 8/2017 |
| CN | 109634012 A | 4/2019 |
| TW | I686738 B | 3/2020 |

* cited by examiner

ARRAY SUBSTRATE AND DISPLAY PANEL

FIELD

The present disclosure relates to the field of display technologies, and more particularly, relates to an array substrate and a display panel.

BACKGROUND

In signal line layouts of conventional gate on array (GOA) circuits, clock signal lines generally have high voltage and high frequency. Furthermore, in order to narrow frames at a right side and a left side of display panels, the clock signals lines are disposed between pixel units, just like data lines. Thus, distances between the clock signal lines are short, easily leading to interference and coupling between the clock signal lines and the data lines, thereby causing data signals to be unstable. A solution is to evenly space the clock signal lines and the data lines; however, it not only consumes more space, but also compresses an effective area of an opening area of the pixel units.

Therefore, in conventional display panel technologies, interference and coupling easily happen when the clock signal lines and the data lines in display panels are too close, which affects stability of the data lines. On the other hand, if the clock signal lines and the data lines are too far apart, the signal lines occupy too much space in display panels, thereby compressing the effective area of the opening area of the pixel units. The above issues urgently need to be solved.

SUMMARY

Embodiments of the present disclosure provide an array substrate and a display panel to solve following issues: in convention display panel technologies, interference and coupling easily happen when the clock signals wires and the data lines in display panels are too close, which affects stability of the data lines. On the other hand, if the clock signals wires and the data lines are too far, the signals lines occupy too much space in display panels, thereby compressing the effective area of an opening area of the pixel units.

An embodiment of the present disclosure provides an array substrate, including a plurality of data lines, a plurality of scan lines, a plurality of clock signal lines, and a plurality of pixel units formed by the data lines and the scan lines horizontally and vertically crossing each other. The data lines are disposed between two adjacent columns of the pixel units. The scan lines are disposed between two adjacent rows of the pixel units. The clock signal lines in an opening area of the pixel units are disposed in a plurality of orthographic projection areas of a plurality of trunk electrodes, are parallel to the data lines, and are disposed on a different layer from the pixel electrodes. The pixel units further include the opening area and a non-opening area, wherein a first thin film transistor (TFT) section is disposed in the non-opening area in a main pixel area.

In one embodiment, a second TFT section is disposed in the non-opening area in a sub-pixel area.

In one embodiment, the clock signal lines in the opening area of the pixel units are a plurality of first clock signal lines, and the clock signal lines in the non-opening area of the pixel units are a plurality of second clock signal lines.

In one embodiment, the second clock signal lines bypass the first TFT section and the second TFT section and are parallel to the data lines.

In one embodiment, a horizontal distance between the first clock signal lines and the data lines is a first distance, a horizontal distance between the second clock signal lines and the data lines is a second distance, and the first distance is greater than the second distance.

In one embodiment, the trunk electrodes include a plurality of first trunk electrodes and a plurality of second trunk electrodes, the first trunk electrodes are parallel to the data lines, and the second trunk electrodes are parallel to the scan lines.

In one embodiment, the first trunk electrodes are disposed at a vertical centerline of the pixel units, and the second trunk electrodes are disposed at a horizontal centerline of the pixel units, so that the first trunk electrodes and the second trunk electrodes divide the pixel units into four pixel areas with equal size.

In one embodiment, the array substrate includes a substrate, and a first metal layer, a first insulating layer, a second metal layer, a second insulating layer, and a planarization layer, which are sequentially stacked on the substrate, and the clock signal lines are disposed on the first metal layer or the second metal layer.

In one embodiment, when the clock signal lines are disposed on the first metal layer, the first metal layer is disconnected at a location where the first metal layer passes through the clock signal lines, so that the clock signal lines pass through the first metal layer. Two through holes area are defined on two sides of the first metal layer near the clock signal lines, and the two through holes are connected to each other by a metal oxide, thereby connecting the first metal layer.

In one embodiment, the array substrate is a gate on array (GOA) array substrate, and a backlight module of the array substrate is a direct-type backlight module or an edge-type backlight module.

The present disclosure further provides an array substrate, including a plurality of data lines, a plurality of scan lines, a plurality of clock signal lines, and a plurality of pixel units formed by the data lines and the scan lines horizontally and vertically crossing each other. The data lines are disposed between two adjacent columns of the pixel units. The scan lines are disposed between two adjacent rows of the pixel units. The clock signal lines in an opening area of the pixel units are disposed in a plurality of orthographic projection areas of a plurality of trunk electrodes, are parallel to the data lines, and are disposed on a different layer from the pixel electrodes.

In one embodiment, the clock signal lines in the opening area of the pixel units are a plurality of first clock signal lines, and the clock signal lines in the non-opening area of the pixel units are a plurality of second clock signal lines.

In one embodiment, the second clock signal lines bypass the first TFT section and the second TFT section and are parallel to the data lines.

In one embodiment, a horizontal distance between the first clock signal lines and the data lines is a first distance, a horizontal distance between the second clock signal lines and the data lines is a second distance, and the first distance is greater than the second distance.

In one embodiment, the trunk electrodes include a plurality of first trunk electrodes and a plurality of second trunk electrodes, the first trunk electrodes are parallel to the data lines, and the second trunk electrodes are parallel to the scan lines.

In one embodiment, the first trunk electrodes are disposed at a vertical centerline of the pixel units, and the second trunk electrodes are disposed at a horizontal centerline of the pixel units, so that the first trunk electrodes and the second trunk electrodes divide the pixel units into four pixel areas with equal size.

In one embodiment, the array substrate includes a substrate, and a first metal layer, a first insulating layer, a second metal layer, a second insulating layer, and a planarization layer, which are sequentially stacked on the substrate, and the clock signal lines are disposed on the first metal layer or the second metal layer.

In one embodiment, when the clock signal lines are disposed on the first metal layer, the first metal layer is disconnected at a location where the first metal layer passes through the clock signal lines, so that the clock signal lines pass through the first metal layer. Two through holes area are defined on two sides of the first metal layer near the clock signal lines, and the two through holes are connected to each other by a metal oxide, thereby connecting the first metal layer.

In one embodiment, the array substrate is a gate on array (GOA) array substrate, and a backlight module of the array substrate is a direct-type backlight module or an edge-type backlight module.

The present disclosure further provides a display panel, including a first substrate, a second substrate, and a liquid crystal layer disposed between the first substrate and the second substrate. The first substrate is the array substrate mentioned above, the second substrate is a color filter substrate, and the array substrate is disposed opposite to the color filter substrate.

Compared with conventional technologies, the array substrate and the display panel have following beneficial effects:

An embodiment of the present disclosure provides an array substrate, including a plurality of data lines, a plurality of scan lines, a plurality of clock signal lines, and a plurality of pixel units formed by the data lines and the scan lines horizontally and vertically crossing each other. The data lines are disposed between two adjacent columns of the pixel units, and the scan lines are disposed between two adjacent rows of the pixel units. The clock signal lines in an opening area of the pixel units are disposed in a plurality of orthographic projection areas of a plurality of trunk electrodes, are parallel to the data lines, and are disposed on a different layer from the pixel electrodes. The signal lines do not occupy too much space in the display panel, and an effective area of an opening area of pixel units is not compressed, Furthermore, distances between the clock signal lines and the data lines are increased, thereby preventing stability of the data lines from being affected due to interference and coupling between the clock signal lines and the data lines. In addition, the clock signal lines may be made of metal materials or material oxide materials. When the clock signal lines are made of the metal materials, widths of the clock signal lines can be minimized, and space in the display panel occupied by the clock signal lines can be reduced.

DESCRIPTION OF DRAWINGS

Technical solutions and beneficial effects of the present disclosure are illustrated below in detail in conjunction with drawings and specific embodiments.

DETAILED DESCRIPTION

Figure 1:
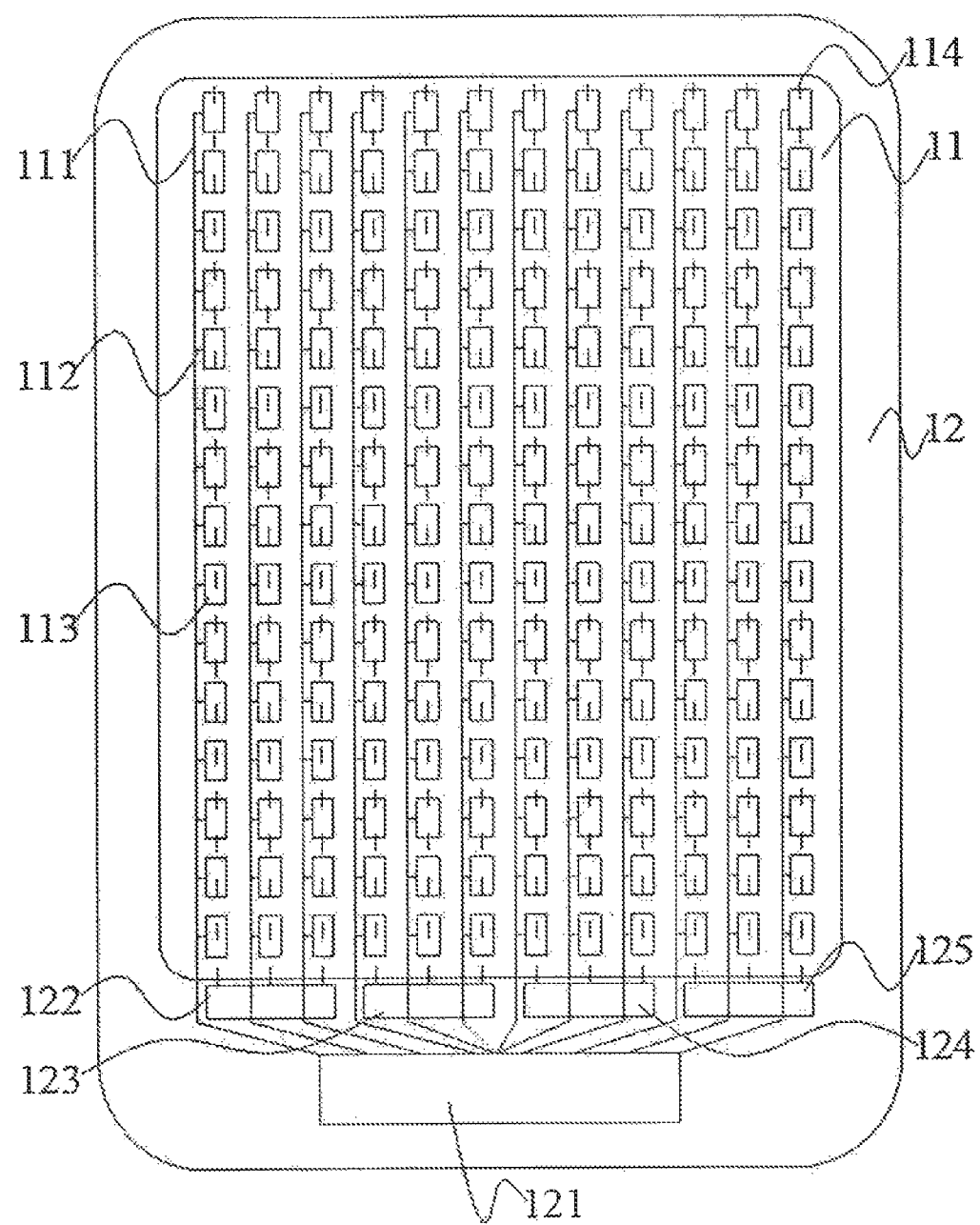
FIG. 1 is a first schematic structural view showing a display panel provided by an embodiment of the present disclosure.

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure below provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Specifically, please refer to FIG. 1 to FIG. 6, an embodiment of the present disclosure provides an array substrate and a display panel.

In conventional GOA substrates, in order to narrow frames at a right side and a left side of display panels, the clock signals lines are disposed between pixel units, just like data lines. Thus, distances between the clock signal lines are short, easily leading to interference and coupling between the clock signal lines and the data lines, thereby causing data signals to be unstable. A solution is to evenly space the clock signal lines and the data lines; however, it not only consumes more space, but also compresses an effective area of an opening area of the pixel units. Therefore, the present disclosure provides an array substrate and a display panel to solve the above problem.

Please refer to FIG. 1, a first schematic structural view showing a display panel according to an embodiment of the present disclosure is provided. A display panel 1 includes a display area 11 and a non-display area 12. The display area 11 include a plurality of data lines 111, which are parallel to each other and are sequentially vertically disposed; a plurality of scan lines 112, which are parallel to each other and are sequentially horizontally disposed; a plurality of pixel units 113 including the data lines 111 and the scan lines 112; and a plurality of clock signal lines 114 disposed below a plurality of projections of a vertical centerline of the pixel units. The non-display area 12 of the display panel 1 includes a driver chip 121, a first clock signal source 122, a second clock signal source 123, a third clock signal source 124, and a fourth clock signal source 125. The data lines 111 in the display area 11 and the driver chip 121 in the non-display area 12 are electrically connected. The clock signal lines 114 in the display area 11 and the clock signal source in the non-display area 12 are electrically connected.

Figure 2:
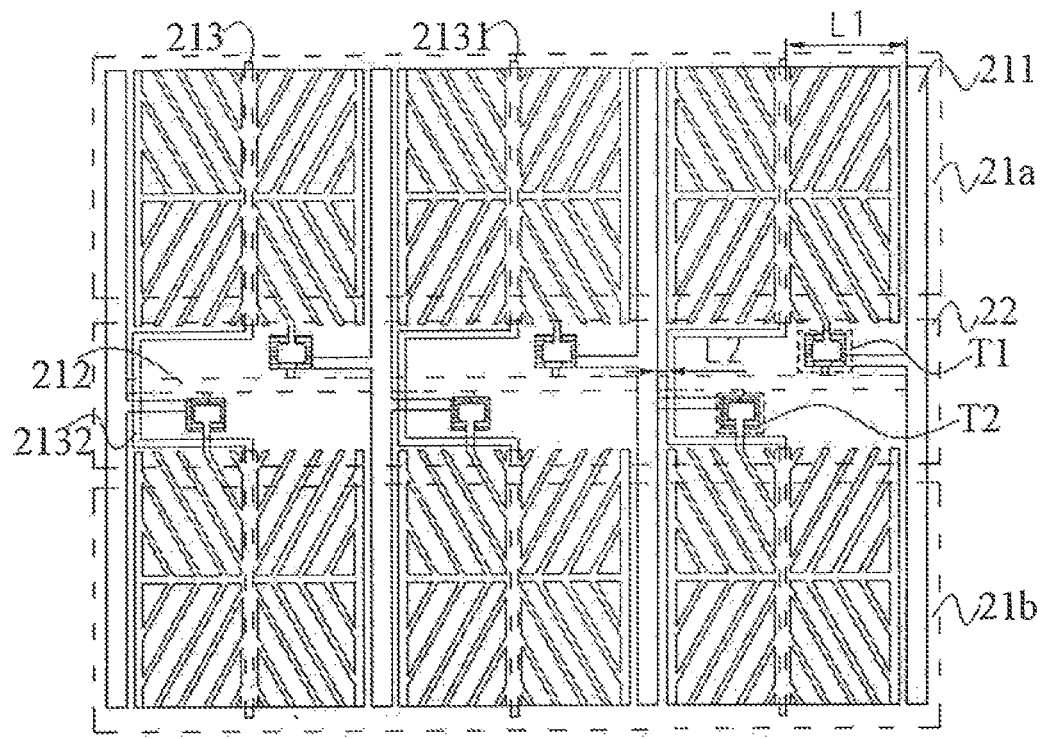
FIG. 2 is first schematic structural view showing an array substrate provided by an embodiment of the present disclosure.

Furthermore, please refer to FIG. 2, a first schematic structural view of the array substrate according to an embodiment of the present disclosure is provided. A plurality of pixel areas arranged in an array manner are defined on the array substrate. A data line 211 is disposed between two adjacent columns of the pixel areas. Each of the pixel areas includes a scan line 212 that divides each of the pixel units into a main pixel area and a sub-pixel area. The main pixel and the sub-pixel area in each of the pixel units are electrically connected to the data lines 211 disposed between two adjacent pixel areas. Each of the pixel units further includes an opening area 21 and a non-opening area 22. A first thin film transistor (TFT) section T1 is disposed in the non-opening area 22 in the main pixel area. A second TFT section T2 is disposed in the non-opening area 22 in the sub-pixel area. The clock signal lines 213 in the non-opening area 22 of the pixel units are a plurality of second clock signal lines 2132. The second clock signal lines 2132 bypass the first TFT section T1 and the second TFT section T2 and are parallel to the data lines 211. Distances between the second clock signal lines 2132 and the data lines 211 are second distances L2.

Specifically, the first TFT section T1 and the second TFT section T2 may be a TFT, a field-effect transistor, or other devices with same property. Because a source and a drain of the transistor used in the present disclosure are symmetrical to each other, the source and the drain are interchangeable. A gate of the first TFT section T1 is electrically connected to the scan line 212 corresponding to the pixel unit where the gate is disposed, a source of the first TFT section T1 is electrically connected to the data line 211 corresponding to the pixel unit where the source is disposed, and a drain of the first TFT section T1 is electrically connected to an electrode of the main pixel area. A gate of the second TFT section T2 is electrically connected to the scan line 112 corresponding to the pixel unit where the gate is disposed, a source of the second TFT section T2 is electrically connected to the data line 212 corresponding to the pixel unit where the source is disposed, and a source of the second TFT section T2 is electrically connected to an electrode of the sub-pixel area.

Furthermore, an opening area 21 of the pixel units is divided into an opening area 21a of the pixel area and an opening area 21b of the sub-pixel area. A pixel electrode with a pozidriv shape (please refer to FIG. 2) is disposed in both the opening area 21a of the pixel area and the opening area 21b of the sub-pixel area. That is, every main pixel area and every sub-pixel area are divided into four pixel regions with equal size by a plurality of first trunk electrodes disposed at a vertical centerline and a plurality of second trunk electrodes disposed at a horizontal centerline, thereby allowing corresponding liquid crystals to orient in different directions, and solving a problem of color shifting.

Furthermore, a first clock signal line 2131 of the first trunk electrodes 213, which is parallel to the data lines 211, is further disposed below the first trunk electrodes in the opening area 21 of the pixel units. Distances between the first clock signal lines 2131 and the data lines 211 are first distances L1, and the first distances L1 are greater than the second distances L2.

Furthermore, a width of the first clock signal lines 2131 is less than or equal to a width of the first trunk electrodes. Preferably, the first clock signal line 2131 is fully blocked by the first trunk electrodes.

Furthermore, the pixel units include a red sub-pixel R, a green sub-pixel G, and a blue sub-pixel B. Of course, the pixel units may further include a white sub-pixel, a yellow sub-pixel, and other sub-pixels of different colors, which will not affect the present disclosure.

Figure 3:
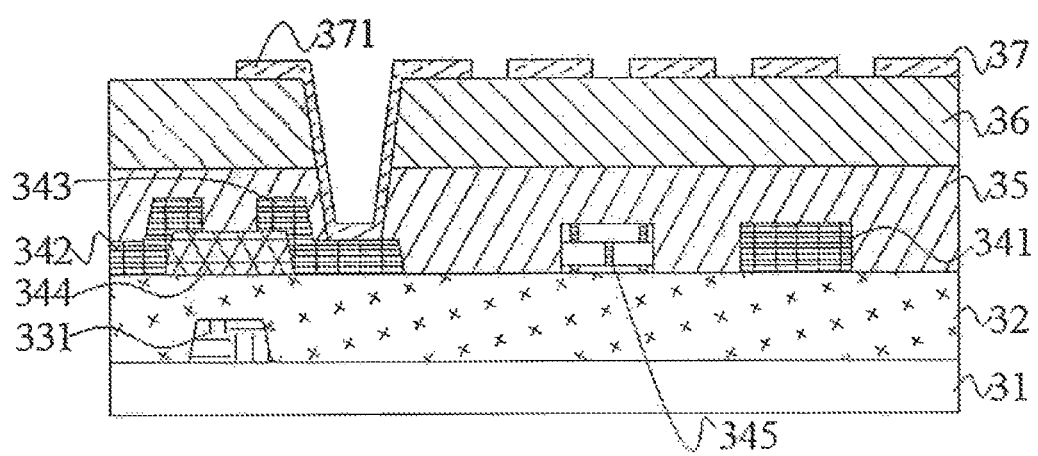
FIG. 3 is a second schematic structural view showing the array substrate provided by an embodiment of the present disclosure.

Please refer to FIG. 3, a second schematic structural view showing the array substrate according to an embodiment of the present disclosure is provided. An array substrate 3 specifically includes: a first substrate 31 disposed on a bottom side of the array substrate 3, wherein the first substrate 31 is typically a transparent glass substrate.

A first insulating layer 32 is disposed on a side of the first substrate 31, wherein a material of the first insulating layer 32 may be silicon oxide, silicon nitride, or a composite film consisting of thereof.

A first metal layer 33 is disposed in the first insulating layer 32, wherein the first metal layer 33 includes a plurality of scan lines and a plurality of gate lines 331 disposed on a side of the first insulating layer near the first substrate. The scan lines output a current and a voltage to the gate lines 331, and the first metal layer 33 is usually made of molybdenum, aluminum, an aluminum nickel alloy, gold, chromium, copper, a titanium aluminum alloy, or combinations thereof.

A second insulating layer 35 is disposed on a side of the first insulating layer 32 away from the first substrate 31, wherein a material of the second insulating layer 35 may be same as that of the first insulating layer.

A second metal layer 34 is disposed in the second insulating layer 35, wherein the second metal layer 34 includes a plurality of data lines 341, a source 342, a drain 343, an active layer 344, and a plurality of clock signal lines 345, which are disposed on a side of the second insulating layer near the first insulating layer. The data lines 341 provide a current for the source 342 and the drain 343, which are electrically connected to a doped area of the active layer 344, and a material of the second metal layer 34 may be same as that of the first metal layer, and preferably, is a titanium aluminum alloy;

A planarization layer 36 is disposed on a side of the second insulating layer 35 away from the first insulating layer, wherein the planarization layer 36 is configured to flatten a surface of the array substrate.

A pixel through hole 371 and a pixel electrode 37 are further defined on a side of the planarization layer 36 away from the second insulating layer, wherein the pixel through hole 371 passes through the planarization layer 36 and the second insulating layer 35, and is electrically connected to the drain 343.

In one embodiment of the present disclosure, the clock signal lines are disposed below the first trunk electrodes of the pixel units. The clock signal lines and the data lines 341 are disposed in the second metal layer 34, as shown in FIG. 3.

Figure 4:
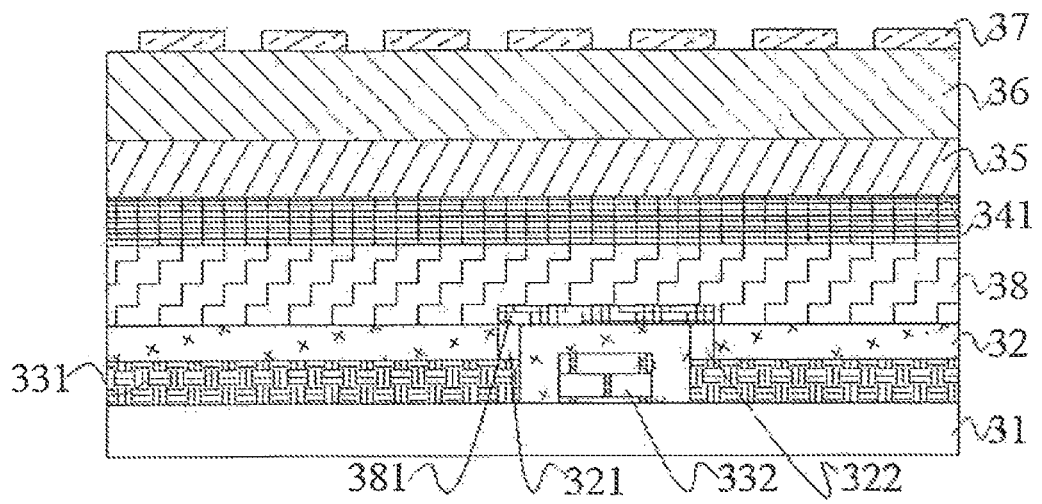
FIG. 4 is a third schematic structural view showing the array substrate provided by an embodiment of the present disclosure.

As shown in FIG. 4, a third schematic structural view showing the array substrate according to an embodiment of the present disclosure is provided. In another embodiment of the present disclosure, the array substrate 3 also includes: a first substrate disposed on a bottom side of the array substrate 3, wherein the first substrate 31 is typically a transparent glass substrate.

A first insulating layer 32 is disposed on a side of the first substrate 31, wherein a material of the first insulating layer 32 may be silicon oxide, silicon nitride, or a composite film consisting of thereof. In addition, a first through hole 321 and a second through hole 322 are further defined on a side of the first insulating layer 32 away from the first substrate 31.

A first metal layer 33 is disposed in the first insulating layer 32, wherein the first metal layer 33 includes a plurality of scan lines and a plurality of gate lines 331 disposed on a side of the first insulating layer near the first substrate. The scan lines output a current and a voltage to the gate lines 331, and the first metal layer 33 is usually made of molybdenum, aluminum, an aluminum nickel alloy, gold, chromium, copper, a titanium aluminum alloy, or combinations thereof. In addition, the clock signals lines 322 are also disposed in the first metal layer 33 and pass through the first metal layer 33. The first metal layer 33 is disconnected, so that the clock signals lines 322 may pass through it. The first through hole 321 and the second through hole 322 are respectively disposed at two sides of the clock signal lines 332 away from the first substrate 31. An end of the first through hole 321 and an end of the second through hole 322 are electrically connected to the first metal layer 33.

A second insulating layer 35 is disposed on a side of the first insulating layer 32 away from the first substrate 31, wherein a material of the second insulating layer 35 may be same as that of the first insulating layer.

A second metal layer 34 is disposed in the second insulating layer 35, wherein the second metal layer 34 include a plurality of data lines 341, a source 342, a drain 343, an active layer 344, and a plurality of clock signal lines 345, which are disposed on a side of the second insulating layer near the first insulating layer. The data lines 341 provide a current for the source 342 and the drain 343, which are electrically connected to a doped area of the active layer 344. A material of the second metal layer 34 may be same as that of the first metal layer, and preferably, it is a titanium aluminum alloy.

A planarization layer 36 is disposed on a side of the second insulating layer 35 away from the first insulating layer, wherein the planarization layer 36 is configured to flatten a surface of the array substrate.

A pixel through hole 371 and a pixel electrode 37 are further defined on a side of the planarization layer 36 away from the second insulating layer, wherein the pixel through hole 371 passes through the planarization layer 36 and the second insulating layer 35, and is electrically connected to the drain 343.

In addition, a third insulating layer 38 is further disposed in the array substrate 3 and is disposed between the first insulating layer 32 and the second insulating layer 35. A layer of a metal oxide 381 is disposed in the third insulating layer 38, an end of the metal oxide 381 is connected to the first through hole 321, and another end of the metal oxide 381 is connected to the second through hole 322. Therefore, the first metal layer 381 can be connected to the metal oxide 381 by the first through hole 322 at where the clock signal lines 322 pass through the first metal layer 381, thereby preventing short circuiting from happening between the first metal layer 381 and the clock signal lines 322. Furthermore, a thickness of the third insulating layer is relatively small, and the thickness of the third insulating layer 38 is less than a thickness of the first insulating layer 32 or a thickness of the second insulating layer 35.

Furthermore, the array substrate is a GOA array substrate, and a backlight module of the array substrate is a direct-type backlight module or an edge-type backlight module.

Figure 5:
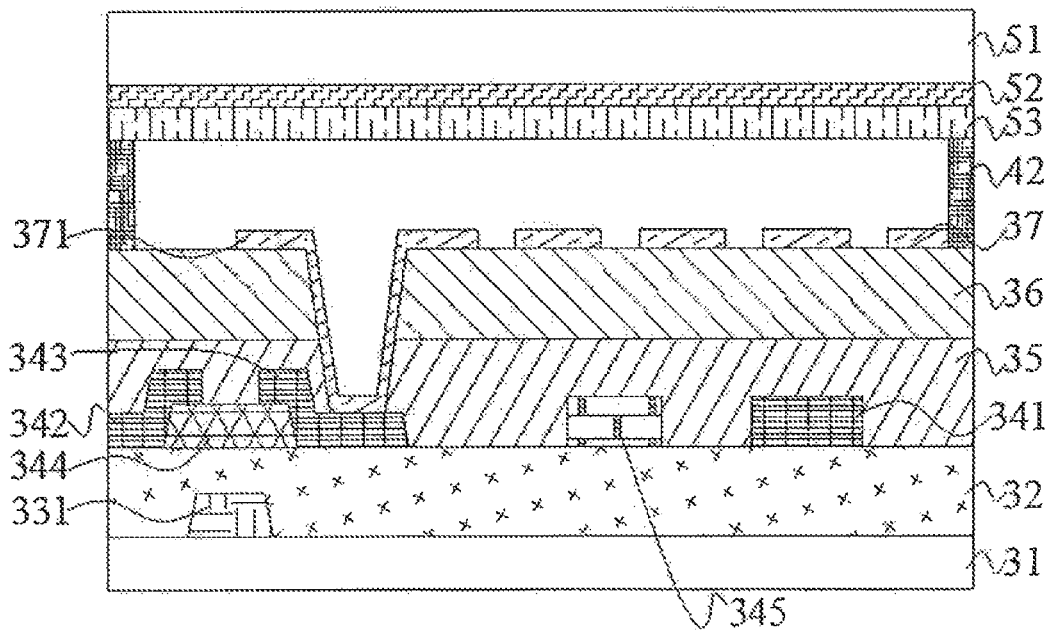
FIG. 5 is a second schematic structural view showing the display panel provided by an embodiment of the present disclosure.

Please refer to FIG. 5, a second schematic structural view showing a display panel according to an embodiment of the present disclosure is provided. The display panel includes a first substrate, a second substrate, and a liquid crystal layer 4 disposed between the first substrate and the second substrate. The first substrate is the array substrate 3, which adopts the clock signal lines 345 and is disposed in the second metal layer 34. The second substrate is a color filter substrate 5. The array substrate 3 is disposed opposite to the color filter substrate 5.

Furthermore, the second substrate includes a second substrate 51, a black matrix 52, and a common electrode layer 53. The common electrode layer 53 is disposed on a side near the liquid crystal layer 4, the black matrix 52 is disposed on a side of the common electrode layer 53 away from the liquid crystal layer 4, and the second substrate is disposed on a side of the black matrix 52 away from the common electrode layer 53.

Furthermore, the liquid crystal layer 4 further includes a plurality of liquid crystals 41, and a frame sealant 42 disposed around the liquid crystals 41 and configured to attach the array substrate 3 to the color filter substrate 5.

Figure 6:
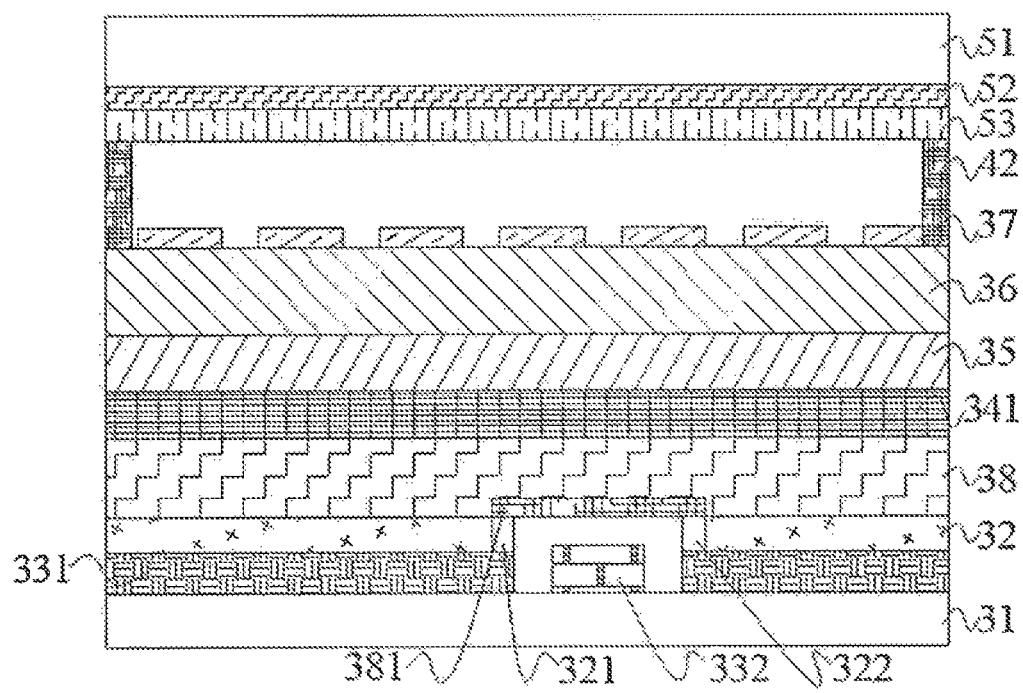
FIG. 6 is a third schematic structural view showing the display panel provided by an embodiment of the present disclosure.

Please refer to FIG. 6, a third schematic structural view showing the display panel according to an embodiment of the present disclosure is provided. The display panel includes a first substrate, a second substrate, and a liquid crystal layer 4 disposed between the first substrate and the second substrate. The first substrate is the array substrate 3, which adopts the clock signal lines 345 and is disposed in the first metal layer 33. The second substrate is the color filter substrate. The array substrate 3 is disposed opposite to the color filter substrate 5.

Furthermore, the second substrate includes a second substrate 51, a black matrix 52, and a common electrode layer 53. The common electrode layer 53 is disposed on a side near the liquid crystal layer 4, the black matrix 52 is disposed on a side of the common electrode layer 53 away from the liquid crystal layer 4, and the second substrate is disposed on a side of the black matrix 52 away from the common electrode layer 53.

Furthermore, the liquid crystal layer 4 further includes a plurality of liquid crystals 41, and a frame sealant 42 disposed around the liquid crystals 41 and configured to attach the array substrate 3 to the second substrate 5.

The present disclosure provides an array substrate, including a plurality of data lines, a plurality of scan lines, a plurality of clock signal lines, and a plurality of pixel units formed by the data lines and the scan lines horizontally and vertically crossing each other. The data lines are disposed between two adjacent columns of the pixel units. The scan lines are disposed between two adjacent rows of the pixel units. The clock signal lines in an opening area of the pixel units are disposed in a plurality of orthographic projection areas of a plurality of trunk electrodes, are parallel to the data lines, and are disposed on a different layer from the pixel electrodes. The signal lines do not occupy too much space in the display panel, and an effective area of an opening area of pixel units does not be compressed. Furthermore, distances between the clock signal lines and the data lines are increased, thereby preventing stability of the data lines from being affected due to interference and coupling between the clock signal lines and the data lines. Moreover, the clock signal lines can be made of a metal material or a metal oxide material. When the clock signal lines are made of the metal materials, widths of the clock signal lines can be minimized, and space in the display panel occupied by the clock signal lines can be reduced.

In the above embodiments, the focus of each embodiment is different, and for a part that is not detailed in an embodiment, reference may be made to related descriptions of other embodiments.

An array substrate and a display device have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. An array substrate, comprising a plurality of data lines, a plurality of scan lines, a plurality of clock signal lines, and a plurality of pixel units formed by the data lines and the scan lines horizontally and vertically crossing each other, wherein the data lines are disposed between two adjacent columns of the pixel units, the scan lines are disposed between two adjacent rows of the pixel units, the clock signal lines in an opening area of the pixel units are disposed in a plurality of orthographic projection areas of a plurality of trunk electrodes, are parallel to the data lines, and are disposed on a different layer from pixel electrodes; and the pixel units further include the opening area and a non-opening area, wherein a first thin film transistor (TFT) section is disposed in the non-opening area in a main pixel area;

wherein the array substrate comprises a substrate, and a first metal layer, a first insulating layer, a second metal layer, a second insulating layer, and a planarization layer, which are sequentially stacked on the substrate;

wherein the clock signal lines are disposed in the first metal layer, and the first metal layer is disconnected into two disconnected parts for the clock signal lines passing through; voids are horizontally defined between the two disconnected parts and the clock signal lines; and the first insulating layer is disposed on the first metal layer and the clock signal lines, and disposed in the voids; and wherein two through holes are defined in the first insulating layer, and disposed on two disconnected parts of the first metal layer respectively; a metal oxide is provided on the first insulating layer and filled in the two through holes to connect the two disconnected parts of the first metal layer.

2. The array substrate of claim 1, wherein a second TFT section is disposed in the non-opening area in a sub-pixel area.

3. The array substrate of claim 1, wherein the clock signal lines in the opening area of the pixel units are a plurality of first clock signal lines, and the clock signal lines in the non-opening area of the pixel units are a plurality of second clock signal lines.

4. The array substrate of claim 3, wherein the second clock signal lines bypass the first TFT section and the second TFT section and are parallel to the data lines.

5. The array substrate of claim 3, wherein a horizontal distance between the first clock signal lines and the data lines is a first distance, a horizontal distance between the second clock signal lines and the data lines is a second distance, and the first distance is greater than the second distance.

6. The array substrate of claim 1, wherein the trunk electrodes comprise a plurality of first trunk electrodes and a plurality of second trunk electrodes, the first trunk electrodes are parallel to the data lines, and the second trunk electrodes are parallel to the scan lines.

7. The array substrate of claim 6, wherein the first trunk electrodes are disposed at a vertical centerline of the pixel units, and the second trunk electrodes are disposed at a horizontal centerline of the pixel units, so that the first trunk electrodes and the second trunk electrodes divide the pixel units into four pixel areas with equal size.

8. The array substrate of claim 1, wherein the array substrate is a gate on array (GOA) array substrate, and a backlight module of the array substrate is a direct-type backlight module or an edge-type backlight module.

9. An array substrate, comprising a plurality of data lines, a plurality of scan lines, a plurality of clock signal lines, and a plurality of pixel units formed by the data lines and the scan lines horizontally and vertically crossing each other, wherein the data lines are disposed between two adjacent columns of the pixel units, the scan lines are disposed between two adjacent rows of the pixel units, the clock signal lines in an opening area of the pixel units are disposed in a plurality of orthographic projection areas of a plurality of trunk electrodes, are parallel to the data lines, and are disposed on a different layer from pixel electrodes;

wherein the array substrate comprises a substrate, and a first metal layer, a first insulating layer, a second metal layer, a second insulating layer, and a planarization layer, which are sequentially stacked on the substrate;

wherein the clock signal lines are disposed in the first metal layer, and the first metal layer is disconnected into two disconnected parts for the clock signal lines passing through; voids are horizontally defined between the two disconnected parts and the clock signal lines; and the first insulating layer is disposed on the first metal layer and the clock signal lines, and disposed in the voids; and wherein two through holes are defined in the first insulating layer, and disposed on two disconnected parts of the first metal layer respectively; a metal oxide is provided on the first insulating layer and filled in the two through holes to connect the two disconnected parts of the first metal layer.

10. The array substrate of claim 9, wherein the clock signal lines in the opening area of the pixel units are a plurality of first clock signal lines, and the clock signal lines in the non-opening area of the pixel units are a plurality of second clock signal lines.

11. The array substrate of claim 10, wherein the second clock signal lines bypass a first TFT section and a second TFT section and are parallel to the data lines.

12. The array substrate of claim 10, wherein a horizontal distance between the first clock signal lines and the data lines is a first distance, a horizontal distance between the second clock signal lines and the data lines is a second distance, and the first distance is greater than the second distance.

13. The array substrate of claim 9, wherein the trunk electrodes comprise a plurality of first trunk electrodes and a plurality of second trunk electrodes, the first trunk electrodes are parallel to the data lines, and the second trunk electrodes are parallel to the scan lines.

14. The array substrate of claim 13, wherein the first trunk electrodes are disposed at a vertical centerline of the pixel units, and the second trunk electrodes are disposed at a horizontal centerline of the pixel units, so that the first trunk electrodes and the second trunk electrodes divide the pixel units into four pixel areas with equal size.

15. The array substrate of claim 9, wherein the array substrate is a gate on array (GOA) array substrate, and a backlight module of the array substrate is a direct-type backlight module or an edge-type backlight module.

16. A display panel, comprising a first substrate, a second substrate, and a liquid crystal layer disposed between the first substrate and the second substrate;

wherein the first substrate is the array substrate of claim 1, the second substrate is a color filter substrate, and the array substrate is disposed opposite to the color filter substrate.

\* \* \* \* \*